(12) United States Patent
Steigerwald et al.

(10) Patent No.: US 7,910,887 B2
(45) Date of Patent: Mar. 22, 2011

(54) ELECTRON-BEAM DEVICE AND DETECTOR SYSTEM

(75) Inventors: Michael D. G. Steigerwald, Westhausen (DE); Dirk Preikszas, Oberkochen (DE); Volker Drexel, Königsbronn (DE)

(73) Assignee: Carl Zeiss NTS GmbH (DE)

( * ) Notice: Subject to any disclaimer, the term of this patent is extended or adjusted under 35 U.S.C. 154(b) by 182 days.

(21) Appl. No.: 12/380,596

(22) Filed: Feb. 27, 2009

(65) Prior Publication Data

US 2009/0309024 A1 Dec. 17, 2009

Related U.S. Application Data

(60) Continuation of application No. 11/594,691, filed on Nov. 8, 2006, now Pat. No. 7,507,962, which is a division of application No. 10/756,797, filed on Jan. 13, 2004, now Pat. No. 7,425,701.

(30) Foreign Application Priority Data

Jan. 16, 2003 (DE) .................................. 103 01 579

(51) Int. Cl.
*H01J 37/28* (2006.01)
*H01J 37/244* (2006.01)
(52) U.S. Cl. ........................................ 250/310; 250/306
(58) Field of Classification Search .................. 250/306, 250/307, 310, 315.3, 493.3
See application file for complete search history.

(56) References Cited

U.S. PATENT DOCUMENTS

| | | | |
|---|---|---|---|
| 5,900,629 A | 5/1999 | Todokoro et al. | |
| 6,011,262 A | 1/2000 | Hamashima et al. | |
| 6,498,345 B1 * | 12/2002 | Weimer et al. | 850/9 |
| 6,545,277 B1 | 4/2003 | Kella et al. | |
| 6,646,262 B1 | 11/2003 | Todokoro et al. | |
| 7,425,701 B2 * | 9/2008 | Steigerwald et al. | 250/310 |
| 7,507,962 B2 * | 3/2009 | Steigerwald et al. | 250/310 |
| 2002/0185599 A1 | 12/2002 | Kimura et al. | |
| 2003/0123049 A1 * | 7/2003 | Gerz et al. | 356/71 |

(Continued)

FOREIGN PATENT DOCUMENTS

DE 19828476 A1 12/1999

(Continued)

OTHER PUBLICATIONS

H. Munack et al., "Design and implementation of a detector for on-axis electrons for enabling enhanced imaging of topographical structures," J. Vac. Sci. Technol. B 17 (1999), 2827-2829.

(Continued)

*Primary Examiner* — Bernard E Souw
(74) *Attorney, Agent, or Firm* — Muirhead and Saturnelli, LLC

(57) ABSTRACT

An electron-beam device having a beam generator for generating an electron beam, an objective lens for focusing the electron beam on an object, and at least one detector for detecting electrons scattered on the object or emitted by the object. Furthermore, a detector system for detecting electrons is described. With an electron-beam device having a detector system according to the present invention, it is possible to make a selection in a simple manner, in particular according to backscattered and secondary electrons. At the same time, as many electrons as possible may be detected using the detector system. For this purpose, the electron-beam device exhibits at least one adjustable diaphragm which is allocated to the detector. The detector system exhibits a detector on which a reflector for reflecting electrons onto the detector is accommodated.

23 Claims, 11 Drawing Sheets

U.S. PATENT DOCUMENTS

2003/0230713 A1 * 12/2003 Golla-Schindler et al. ... 250/310

FOREIGN PATENT DOCUMENTS

| JP | 6139988 | | 5/1994 |
|---|---|---|---|
| JP | 8273569 | A | 10/1996 |
| JP | 9167591 | | 6/1997 |
| JP | 10214586 | A | 8/1998 |
| JP | 10-326586 | | 12/1998 |
| JP | 2000-30654 | | 1/2000 |
| JP | 2000133194 | A | 5/2000 |
| JP | 2001283759 | | 10/2001 |
| JP | 2002124205 | A | 4/2002 |
| WO | WO 01/01439 | A1 | 1/2001 |
| WO | WO 01/75929 | A1 | 10/2001 |

OTHER PUBLICATIONS

L. Frank et al., "A novel in-lens detector for electrostatic scanning LEEM mini-column," Ultramicroscopy 81 (2000), 99-110.

D. W. Ranasinghe et al., "Design of a high efficiency secondary electron collector," Inst. Phys. Conf. Ser. No. 67 (1983), 433-438.

* cited by examiner

ELECTRON-BEAM DEVICE AND DETECTOR SYSTEM

CROSS REFERENCE TO RELATED APPLICATIONS

This application is a continuation of U.S. patent application Ser. No. 11/594,691 filed on Nov. 8, 2006 now U.S. Pat. No. 7,507,962, which is a divisional of U.S. patent application Ser. No. 10/756,797, filed Jan. 13, 2004 (now U.S. Pat. No. 7,425,701), both of which are incorporated by reference herein.

BACKGROUND OF THE INVENTION

1. Technical Field

The present invention relates to an electron-beam device, in particular a scanning electron microscope, having a beam generator for generating an electron beam, an objective lens for focusing the electron beam on an object, and at least one detector for detecting electrons scattered on the object or emitted by the object. Furthermore, the present invention relates to a detector system for detecting electrons, in particular for an electron-beam device (for example, a scanning electron microscope).

2. Description of the Related Art

Electron-beam devices, in particular scanning electron microscopes, are used to examine surfaces of objects (specimens). For this purpose, an electron beam (hereinafter called primary electron beam) is generated in a scanning electron microscope using the beam generator and is focused through the objective lens onto the object to be examined. Using a deflection device, the primary electron beam is guided to scan the surface of the object to be examined. In the process, the electrons of the primary electron beam interact with the object. As a consequence of the interaction, electrons are in particular emitted from the surface of the object (secondary electrons) or electrons of the primary electron beam are backscattered (backscattered electrons). Here, the backscattered electrons exhibit energy in the region of 50 eV up to the energy of the electrons of the primary electron beam at the object, while the secondary electrons exhibit energy of less than 50 eV. Secondary and backscattered electrons form the secondary beam and are detected via a detector. The detector signal generated through this is used for rendering.

Electron-beam devices exhibit a high spatial resolution, which is achieved through a very small diameter of the primary electron beam in the plane of the object. The closer the object is positioned to the objective lens of the electron-beam device, the better the resolution. To detect the secondary or backscattered electrons, the detector is placed here within the objective lens or in a region between the objective lens and the beam generator. Furthermore, the greater the electrons of the primary electron beam are initially accelerated in the electron-beam device and slowed down to a desired final energy at the end in the objective lens or in the region between the objective lens and the object, the better the resolution.

Electron-beam devices that exhibit a ring-shaped detector having a relatively large opening are known. This opening is necessary in order not to influence the primary electron beam in the beam path of the electron-beam device and in order to avoid possible contamination. The reverse paths of the secondary and backscattered electrons in the electron-beam device are influenced by the objective lens due to the different energies of the secondary and backscattered electrons. Here, the crossover of the beam of the secondary electrons lies closer to the object to be examined than the crossover of the beam of the backscattered electrons. The beam of the secondary electrons therefore exhibits more divergence than the beam of the backscattered electrons. However, the secondary and backscattered electrons run on such paths such that the majority of the secondary and backscattered electrons passes through the opening of the detector and is consequently not detected.

In DE 198 28 476 A1, an approach is described in order to avoid the above-mentioned disadvantage. In the electron-beam device known from this publication, two detectors for the secondary and backscattered electrons, each detector exhibiting an opening, are staggered with respect to one another along the optical axis of the electron-beam device. The first detector positioned close to the object detects the electrons that emerge from the object under a relatively large solid angle, while the second detector positioned in the region of the beam generator detects the electrons that emerge from the object under a relatively small solid angle and pass through the opening of the first detector provided for the passage of the primary electron beam. In the electron-beam device known from DE 198 28 476 A1, it is a disadvantage, however, that the second detector always detects a large number of secondary as well as backscattered electrons. The signal obtained using this detector is consequently a mixed signal.

It is known that the backscattered electrons must be detected to increase the resolution of the material contrast. To obtain a particularly good material contrast, it is necessary to capture as many backscattered electrons as possible. This is because the number of detected electrons improves the imaging. The dependency of the imaging on the number of detected electrons applies not just to backscattered electrons but to secondary electrons as well. The higher the number of detected secondary electrons, the better the imaging. A detection of electrons, selected according to secondary and backscattered electrons, is advantageous for carrying out a rendering selected according to the type of electrons.

A scanning electron microscope that separately captures secondary electrons and backscattered electrons is known from US 2002/0185599 A1. For this purpose, two detectors are provided in the scanning electron microscope, which exhibits a beam generator for generating an electron beam and an objective lens for focusing the electron beam on the object. One detector is positioned in the region of the object and detects backscattered electrons. The other detector is positioned above the objective lens and detects secondary electrons. The position of the detector for detecting backscattered electrons must be determined here by simulation, however, which is extremely costly. Moreover, simulations are always fraught with errors so that optimal detection of electrons cannot be achieved.

Accordingly, it is desirable to specify an electron-beam device having a detector system, with which it is possible to make a selection in a simple manner, in particular according to backscattered electrons and secondary electrons. At the same time, as many electrons as possible may be detected using the detector system.

SUMMARY OF THE INVENTION

According to the present invention, an electron-beam device, in particular a scanning electron microscope, is designed with a beam generator for generating an electron beam (hereinafter called primary electron beam), an objective lens for focusing the primary electron beam on an object, and at least one detector for detecting electrons scattered on the object or emitted by the object. Hereinafter, the term "scattered electrons" is in particular understood as the electrons backscattered by the object.

Furthermore, the electron-beam device exhibits at least one adjustable diaphragm which is allocated to the detector. An adjustable diaphragm is understood in particular as a diaphragm adjustable with respect to its position in the electron-beam device and/or a diaphragm whose diaphragm opening (aperture) is adjustable. This will be further explained elsewhere herein.

The electron-beam device according to the present invention is based on the concept that, due to their above-mentioned differing energy, secondary and backscattered electrons each take up a different phase space. This is defined as a location-impulse space, in which the impulse describes the divergence of the secondary or backscattered electrons. Because of the different phase spaces, it is possible to mask a large portion of the secondary electrons in the secondary beam. Only backscattered electrons that the detector is able to detect will then penetrate the diaphragm for the most part. It has come to light that the number of backscattered electrons detected in this manner is much higher than the number detected by devices known from the related art. Because the majority of secondary electrons are masked, they no longer have much influence on the signal generated using the detector for rendering.

Furthermore, it is possible to always position the diaphragm in the electron-beam device where a large number of backscattered electrons may be detected. The preferred position of the diaphragm lies in or near the crossover of the beam of the backscattered electrons that exhibit a desired energy. To adjust the position of the diaphragm, the electron-beam device preferably exhibits at least one positioning device that may be motor-driven or controlled by hand, for example. Using the positioning device, it is possible to position the diaphragm in any direction, for example along the optical axis or the beam path of the secondary beam. It is also an advantage that, using the positioning device, the diaphragm may also be guided out of the beam path of the secondary beam or may be fed into the beam path.

As already mentioned above, the diaphragm preferably exhibits at least one diaphragm opening for the passage of the electrons. The size of this diaphragm opening is preferably adjustable. This presents a further opportunity for obtaining the highest yield of backscattered electrons possible.

The electron-beam device according to the present invention is in particular designed as a scanning electron microscope. In this embodiment, there are of course scanning means for guiding the primary electron beam on the object. The scanning means preferably exhibit two scanning elements per plane (level).

The diaphragm is preferably a mechanical diaphragm having at least one diaphragm opening for the passage of the backscattered electrons toward the detector. In another embodiment, multiple diaphragm openings may be provided in the diaphragm.

To detect backscattered electrons that are scattered by the object at a small angle (hereinafter called small angle backscattered electrons), the diaphragm and the detector are preferably positioned extra-axially to an optical axis of the electron-beam device. The optical axis is understood as the axis on which the electrons of the primary electron beam are directed from the beam generator to the object without the primary electron beam being directed out of the optical axis by deflectors.

In another embodiment of the electron-beam device, the electron-beam device exhibits at least one deflection device having at least one deflector for directing the primary electron beam from and toward the optical axis. This embodiment is particularly well suited when the diaphragm and the detector are extra-axially positioned to the optical axis of the electron-beam device. The primary electron beam is separated from the secondary beam (secondary electrons and backscattered electrons) via the deflection device.

In particular, the deflector of the deflection device is designed as a magnetic unit. The deflector is preferably positioned in the electron-beam device in the region between the object and the beam generator. In another embodiment, the deflection device exhibits a first deflector for directing the primary electron beam out of the optical axis and a second deflector for directing the primary electron beam into the optical axis. A system in which the deflection device exhibits a first deflector for directing the electron beam out of the optical axis, a second deflector for steering the electron beam toward the optical axis, and a third deflector for directing the electron beam into the optical axis has proven expedient. Due to the aforementioned system(s), the normal setup of a scanning electron microscope is retained, in which the beam generator and the object are positioned one on top of the other essentially in a straight line (the optical axis).

The detector is preferably segmented. This means that it includes at least two detection regions, in which one detection region detects electrons of the secondary beam returning axially near the optical axis. The other detection region detects returning electrons that do not return axially near the optical axis in the electron-beam device.

In a further embodiment of the electron-beam device according to the present invention, another detector is arranged in the electron-beam device in addition to the already described detector. As described in greater detail further below, at least one of the two detectors exhibits a diaphragm, in particular in the form of an opposing field grid.

As an alternative hereto, the other detector that has since been added may preferably be designed as the above-described diaphragm to detect secondary electrons.

The detector allocated to the diaphragm normally also exhibits a gap for the primary electron beam since the detector is often positioned along the optical axis of the electron-beam device in the electron-beam device. It was determined in experiments that a portion of backscattered electrons also passes through this gap without being detected by the detector. To improve the detection of the backscattered electrons or electrons that run almost along the optical axis, a particular embodiment of the present invention provides for a reflector to be positioned on the detector to reflect the electrons scattered by the object or emitted by the object. The diaphragm itself is preferably designed as a reflector, in which only certain electrons are reflected onto the detector while other electrons are masked from the secondary beam. In this way, a large number of backscattered electrons that would otherwise be lost are detected. When the backscattered electrons strike, they are scattered on the reflector and then strike an active detection surface of the detector.

The reflector is preferably accommodated in the opening of the detector. If the detector is designed as a combination of a scintillator with an optical waveguide and a photomultiplier, a metallic tube that shields the insulating scintillator against the primary electron beam is often inserted into the hole. In this case, the reflector is preferably accommodated in the metallic tube.

The diaphragm may take on numerous shapes chosen in particular depending on the location in the electron-beam device. However, the diaphragm, in particular the one designed as a reflector, preferably exhibits an area on which lateral faces are arranged that stretch toward a point situated above the area. A triangular or at least a partially conical shape falls under this, for instance. As an alternative or in addition hereto, the diaphragm is designed at least partially discoid.

To absorb the highest possible number of electrons, the diaphragm is preferably made of a material having a low atomic number. However, if the intention is to reflect the highest possible number of electrons, the diaphragm is made of a material having a high atomic number.

The present invention is not exclusively limited to diaphragms that are formed mechanically, for example, a discoid diaphragm having a gap. Rather, in another embodiment of the present invention, the diaphragm is to be designed as a device having at least one opposing field grid. Using a suitably applied voltage, electrons may be selected, in particular secondary and backscattered electrons. In a preferred embodiment of the present invention, at least two detectors are provided, at least one of which exhibits an opposing field grid of this kind. Both detectors preferably have an opposing field grid.

In a further embodiment of the present invention, an electron energy controlling device for accelerating and slowing down the electrons of the electron beam to specified energies as well as for maintaining the energy after acceleration is provided. In the electron-beam devices sold by the applicant, the latter uses a so-called 'beambooster' which ensures that the high energy of the electrons of the primary electron beam is retained along the entire path through an electron beam column. Only after passing the scanning means and the focus means are the electrons slowed down to a desired energy.

The present invention also relates to a detector system for detecting electrons, in particular for an electron-beam device, having at least one detector, on which a reflector for reflecting electrons onto the detector is arranged. Normally, the detector exhibits a gap for the primary electron beam since the detector is often arranged in an electron-beam device along the optical axis of the electron-beam device. Experiments have established that a large portion of electrons of the secondary beam also passes through this gap without being detected by the detector. In order to detect these electrons as well, the reflector is arranged on the detector and reflects the electrons onto the detector, thereby improving the efficiency.

The reflector may be positioned on the detector in the manner already described and may exhibit the above-mentioned shape. Furthermore, a diaphragm may be allocated to the detector, as already described above.

BRIEF DESCRIPTION OF THE DRAWING

Exemplary embodiments of the present invention will now be explained in greater detail with reference to the drawing.

DETAILED DESCRIPTION OF VARIOUS EMBODIMENTS

The present invention will be described in the following by way of example using a scanning electron microscope. It is not limited to scanning electron microscopes but is suitable for any electron-beam device.

Figure 1:
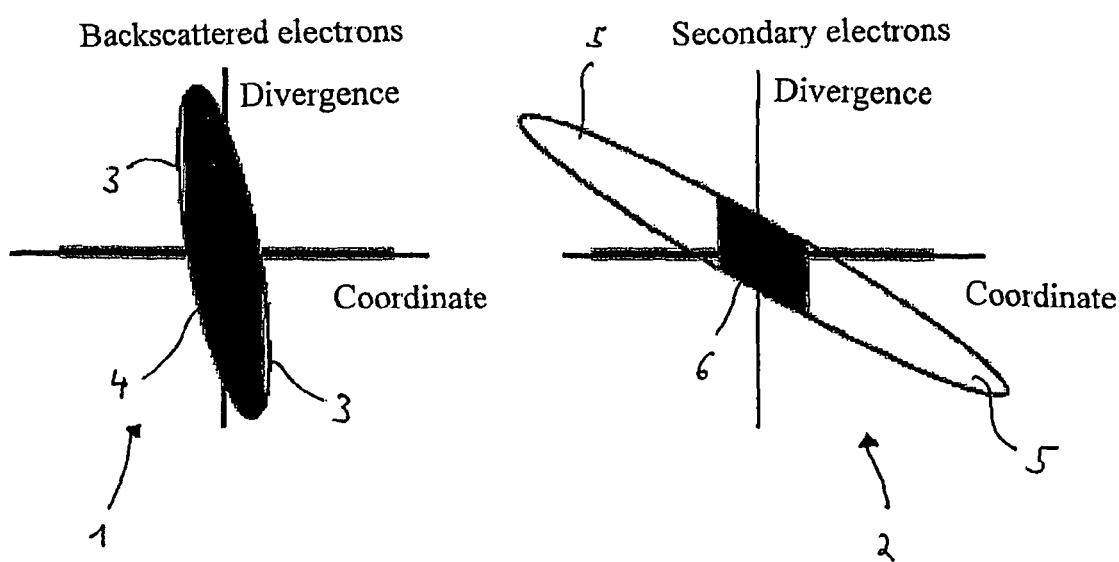
FIG. 1 shows a schematic representation of the phase spaces of secondary and backscattered electrons in a scanning electron microscope.

FIG. 1 shows the various phase spaces that secondary and backscattered electrons exhibit in a scanning electron microscope. This exhibits an electron source via which a primary electron beam is generated and guided toward a specimen. When the primary electron beam strikes the specimen, interactions occur, in the course of which secondary electrons and backscattered electrons in particular develop. Their totality forms a secondary beam, which in turn passes through the scanning electron microscope and is detected via a detector or multiple detectors. As already described above, the backscattered electrons exhibit energy in the region of 50 eV up to the energy of the electrons of the primary electron beam at the object, while the secondary electrons exhibit energy less than 50 eV. Because of these differing energies, the secondary and backscattered electrons exhibit different phase spaces that are depicted in FIG. 1. Phase space 1 relates to backscattered electrons while phase space 2 represents the phase space of secondary electrons. The phase space volume of secondary electrons is very different from that of backscattered electrons.

Using a diaphragm whose position is adjustable using a positioning device in the scanning electron microscope, it is possible to mask a large portion of secondary electrons from the secondary beam. Using the diaphragm, only a-transmission region 6 is allowed through, while region 5 is masked by the diaphragm. The preferred position of the diaphragm lies in or near the crossover of the beam of backscattered electrons.

Through the positioning device, it is possible to move the diaphragm in any direction, along the optical axis or the beam path of the secondary beam, for example. It is also an advantage that, using the positioning device, the diaphragm may also be directed out of the beam path of the secondary beam or directed into the beam path. The diaphragm is positioned where there is excellent yield of the backscattered electrons of the desired energy.

The use of a diaphragm also possibly masks a certain region 3 of backscattered electrons. However, the portion of backscattered electrons (transmission region 4) that may pass through the diaphragm predominates. Using the diaphragm, it is therefore possible to select backscattered and secondary electrons from the secondary beam or to separate a large portion of secondary electrons from backscattered electrons.

The number of backscattered electrons that penetrate the diaphragm is much higher than the number of secondary electrons.

Figure 2:
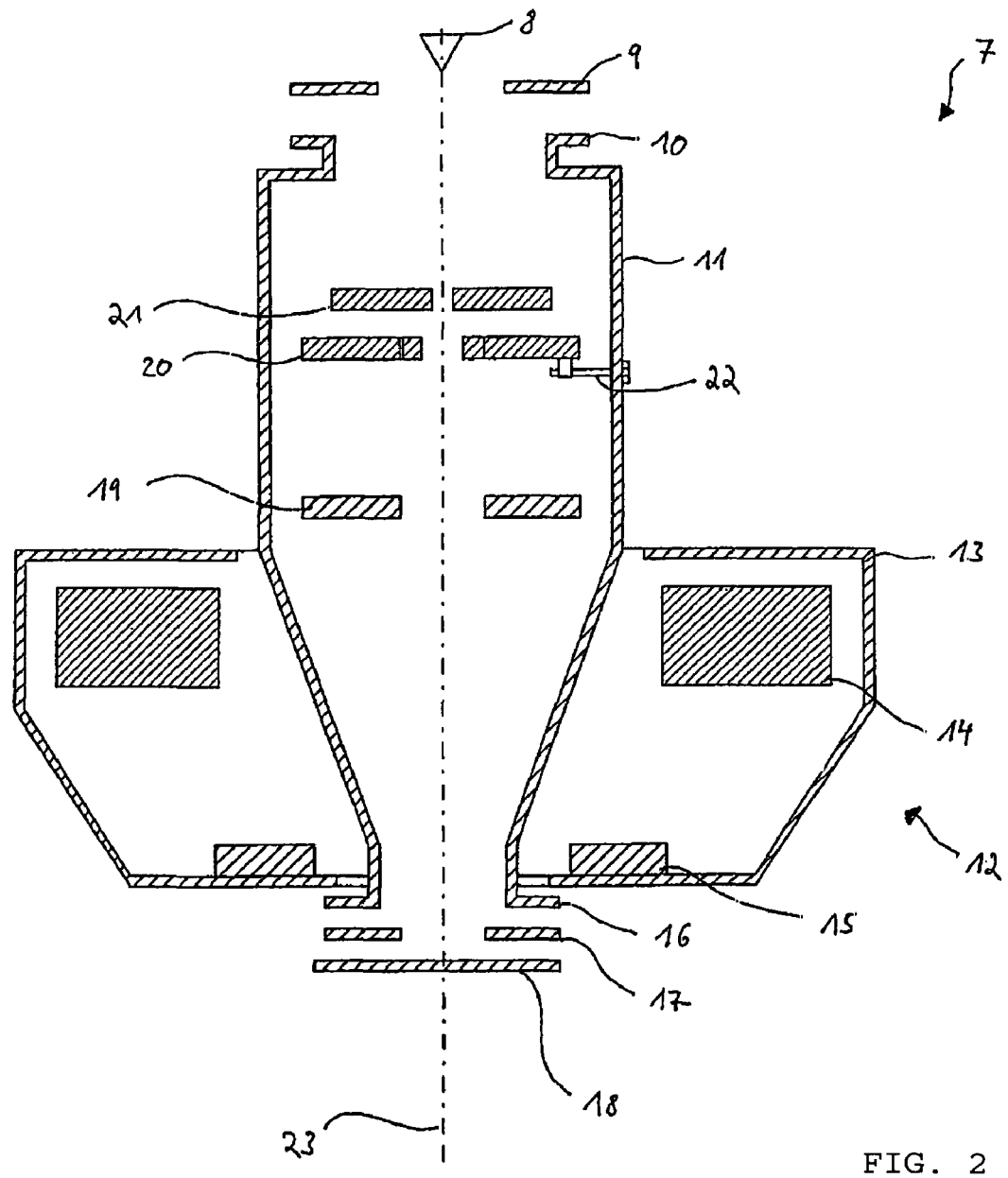
FIG. 2 shows a schematic representation of a scanning electron microscope having a detector and a diaphragm.

FIG. 2 shows the schematic representation of a scanning electron microscope 7. Scanning electron microscope 7 exhibits a beam generator in the form of an electron source 8 (cathode), an extraction electrode 9, as well as an anode 10, which at the same time forms one end of a beam guidance tube 11 of scanning electron microscope 7. Electron source 8 is preferably a thermal field emitter. Electrons that emerge from electron source 8 are accelerated to anode potential on account of a potential difference between electron source 8 and anode 10. In beam guidance tube 11, the energy of the electrons is maintained and slowed down to a desired energy only shortly before striking the specimen, which is explained in greater detail further below. A device having the previously described effects is installed by the applicant in appropriate scanning electron microscopes and referred to as a beam-booster.

Beam guidance tube 11 is directed through a borehole through pole shoe 13 of a magnetic lens acting as a lens system. Coils 14 are arranged in pole shoe 13, as has been known for some time. Connected downstream from beam guidance tube 11 is an electrostatic retarder. This is made up of a single electrode 17 and a tubular electrode 16, which is formed on the end of beam guidance tube 11 opposite specimen 18. Tubular electrode 16 together with beam guidance tube 11 is thus at anode potential while single electrode 17 as well as specimen 18 are at a potential that is lower in relation to the anode potential. This way, the electrons of the primary electron beam may be slowed down to a desired, low energy necessary for examining specimen 18. Furthermore, scanning means 15 are provided, through which the primary electron beam may be deflected and scanned over specimen 18.

To detect secondary electrons or backscattered electrons that develop on account of the interaction of the primary electron beam with specimen 18, a detector system, having a detector 19 and a detector 21, is arranged in beam guidance tube 11. Here, detector 19 is positioned specimen-side along optical axis 23 in beam guidance tube 11, while detector 21 is positioned source-side along optical axis 23. Furthermore, the two detectors 19, 21 are staggered with respect to one another toward optical axis 23 of scanning electron microscope 7 and each exhibits a ring-shaped detection surface. Detector 19 is designed in a known manner as a scintillator having a glass optical waveguide and a photomultiplier connected downstream. The glass optical waveguide guides photons to the photomultiplier in a known manner. Since the glass optical waveguide exhibits a relatively large thickness toward optical axis 23 for high efficiency of the guidance of light, the borehole through the glass optical waveguide normally exhibits a diameter of 2 to 3 mm for the passage of the primary electron beam so that the primary electron beam is not influenced by the glass optical waveguide.

Detector 19 detects those electrons that emerge from specimen 18 under a relatively large solid angle. These are mainly secondary electrons. On the other hand, only a very small portion of electrons scattered back (backscattered electrons) on specimen 18, which exhibit a relatively high kinetic energy in comparison to the secondary electrons when emerging from specimen 18, are detected by detector 19 since the backscattered electrons that pass the direction of acceleration are focused by the lens relatively close to optical axis 23 and are consequently able to pass through the hole in detector 19.

After passing through detector 19, the secondary beam consequently includes secondary electrons as well as backscattered electrons, the majority of the secondary electrons emitted from specimen 18 no longer existing in the secondary beam.

Allocated to detector 21 is a diaphragm 20, which is movable in all directions in beam guidance tube 11 via a positioning device 22. Diaphragm 20 is suitably made of a material having a high atomic number, like gold. When the secondary beam strikes the underside of diaphragm 20, secondary electrons are masked from the secondary beam on account of their energy distribution. Primarily, only backscattered electrons thus transmit through the opening in diaphragm 20 so that they are detectable via detector 21. Detector 21 is segmented and exhibits two detection regions 38 and 39 whose function has already been explained above. The detected backscattered electrons are used in imaging with regard to increasing the material contrast. Positioning device 22 optimally sets the position of diaphragm 20 in order to detect the largest possible number of backscattered electrons of the desired energy. The size of the opening of diaphragm 20 is adjustable using a device not shown.

Figure 3:
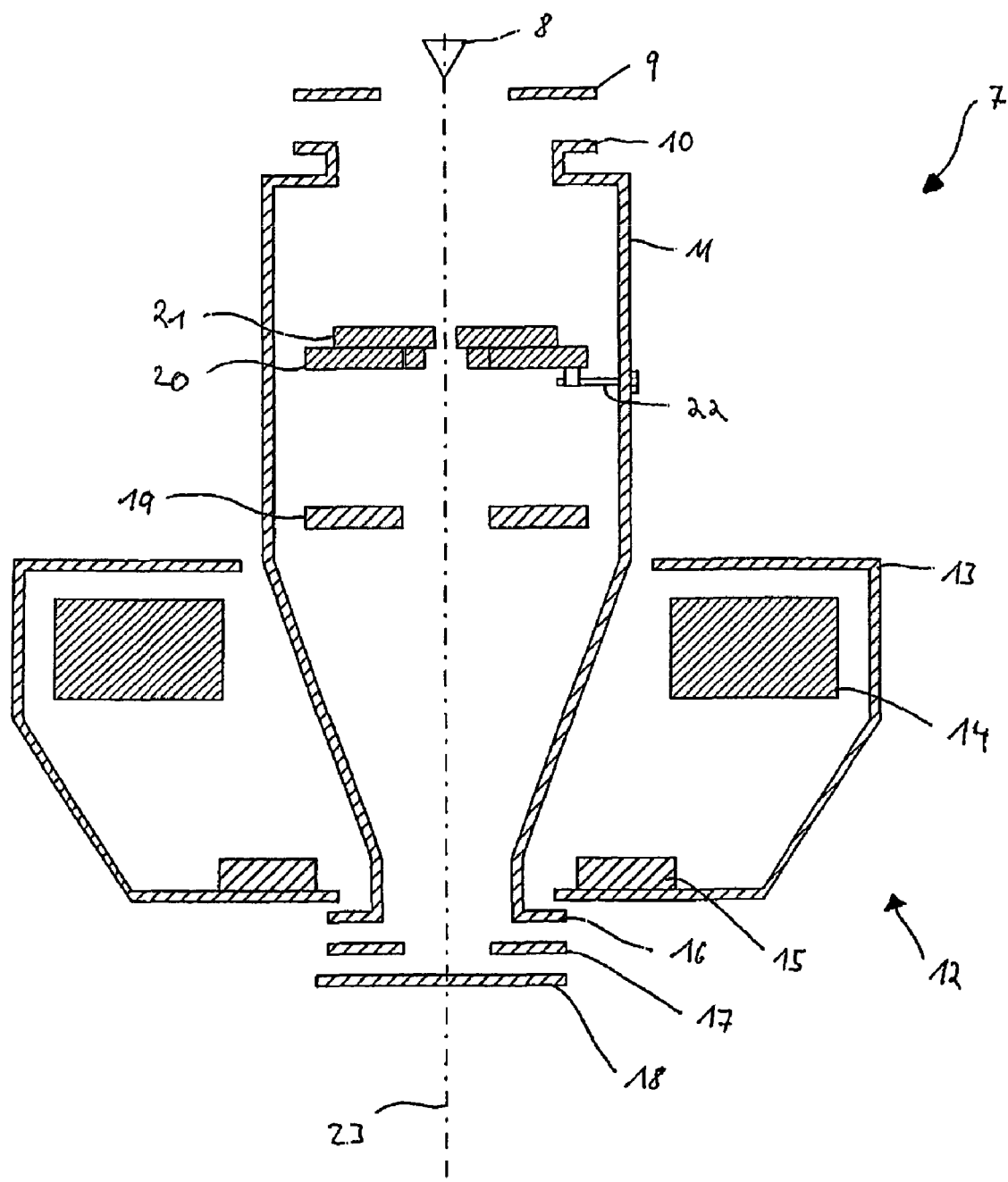
FIG. 3 shows a schematic representation of another scanning electron microscope having a detector and a diaphragm.

FIG. 3 shows another exemplary embodiment of a scanning electron microscope 7. This exemplary embodiment is almost identical to the exemplary embodiment in accordance with FIG. 2. The identical components will be described in the following using the same reference numbers. The exemplary embodiment in accordance with FIG. 3 differs from the exemplary embodiment in accordance with FIG. 2 only to the extent that diaphragm 20 is arranged on detector 21. This should illustrate that, using positioning device 22, the diaphragm may be placed at any position in the scanning electron microscope.

Figure 4:
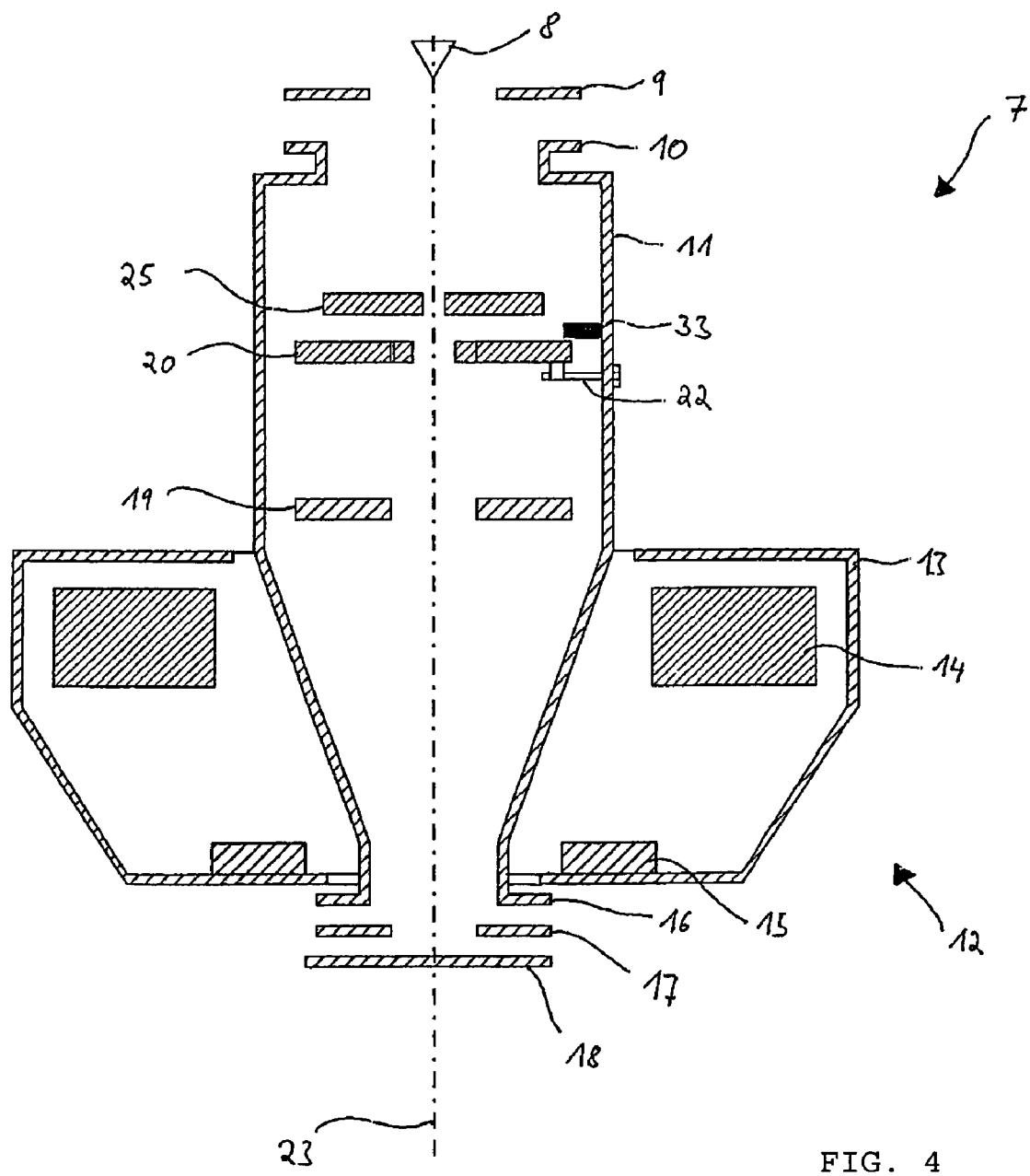
FIG. 4 shows a schematic representation of a scanning electron microscope having a detector designed as a conversion electrode and a diaphragm.

FIG. 4 shows a further exemplary embodiment of a scanning electron microscope 7. Identical components are again identified using the same reference numbers. The exemplary embodiment in accordance with FIG. 4 again exhibits a detector system having two detectors, namely detector 19 and 25. Detector 19 is arranged specimen-side while detector 25 is arranged source-side. Diaphragm 20 is again allocated to detector 25 in a manner already described above. Unlike the previously described exemplary embodiments, detector 25 is designed as a ring-shaped conversion electrode. The conversion electrode is adjustable in both directions perpendicular to the optical axis using an adjusting device not shown. Detector 25 is designed as a thin plate having a thickness of 0.1 to 1 mm, made of a material having a low atomic number (for example, aluminum) and exhibits a small, central hole for the passage of the primary electron beam. The hole diameter is normally 200 μm to 400 μm. On account of the small hole diameter, detector 25 has an aperture-limiting effect on the primary electron beam and simultaneously functions as an aperture diaphragm.

When the secondary beam strikes detector 25, secondary electrons are released from detector 25, drawn to detector 33, and detected there in detector 33. The procedure for drawing off and accelerating the secondary electrons from detector 25 to detector 33 has long been known and will not be described here in greater detail.

Figure 5:
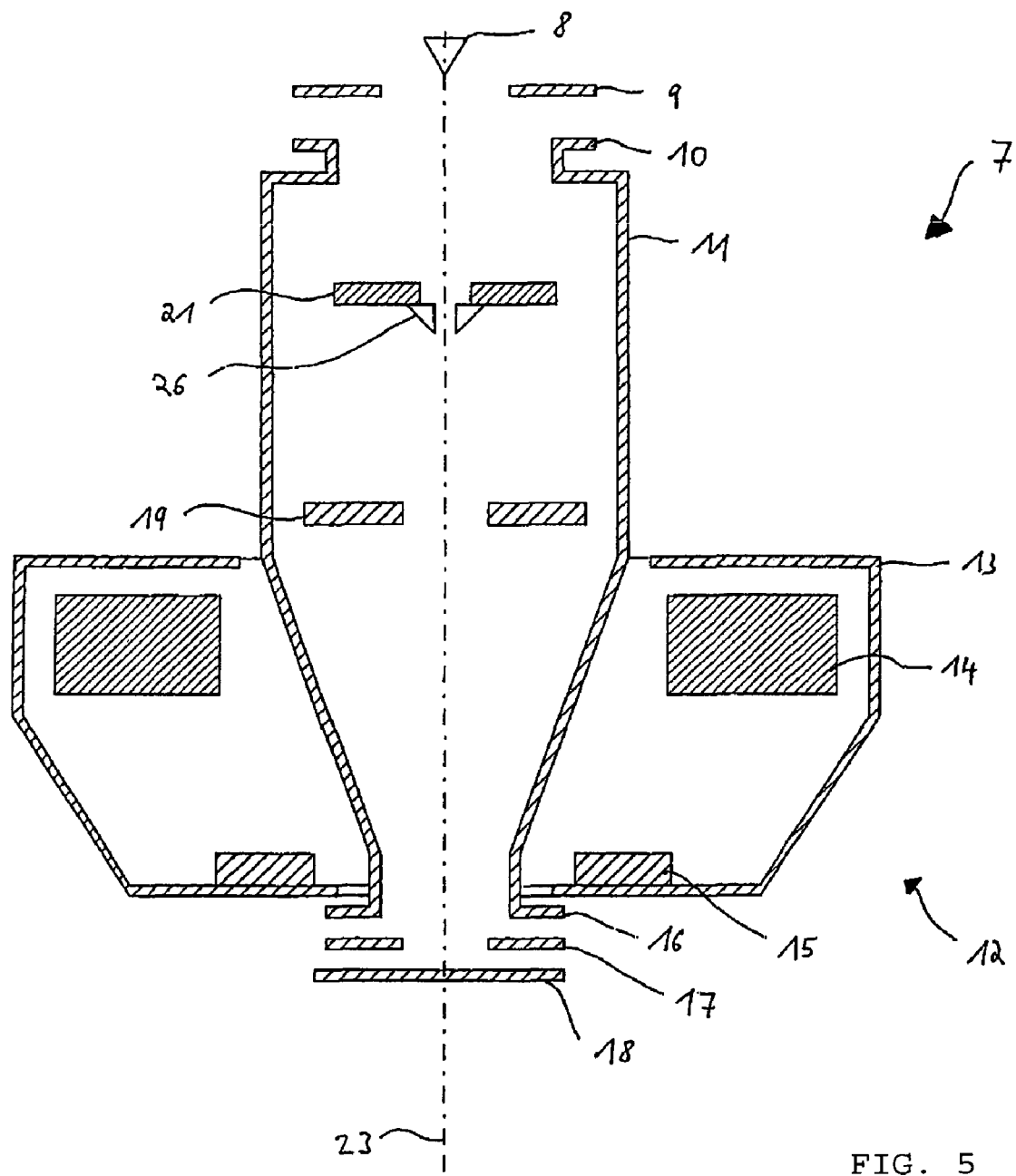
FIG. 5 shows a schematic representation of a scanning electron microscope having a detector that exhibits a reflector.

FIG. 5 shows a further exemplary embodiment of a scanning electron microscope 7 having a detector system that exhibits two detectors 19 and 21. As already described above, detector 19 detects secondary electrons almost exclusively. The arrangement of detector 19 on optical axis 23 is selected such that primarily only backscattered electrons pass through detector 19. Since detector 21 likewise exhibits an opening, some backscattered electrons are able to pass through this opening. They are then not detected and are lost for the rendering.

For this reason, conical diaphragm 26 in the form of a reflector is arranged on detector 21, the reflector advantageously being made of a material having a high atomic number (such as gold). The electrons passing through detector 19 are scattered on the reflector and steered toward the detection surface of detector 19.

Figure 6:
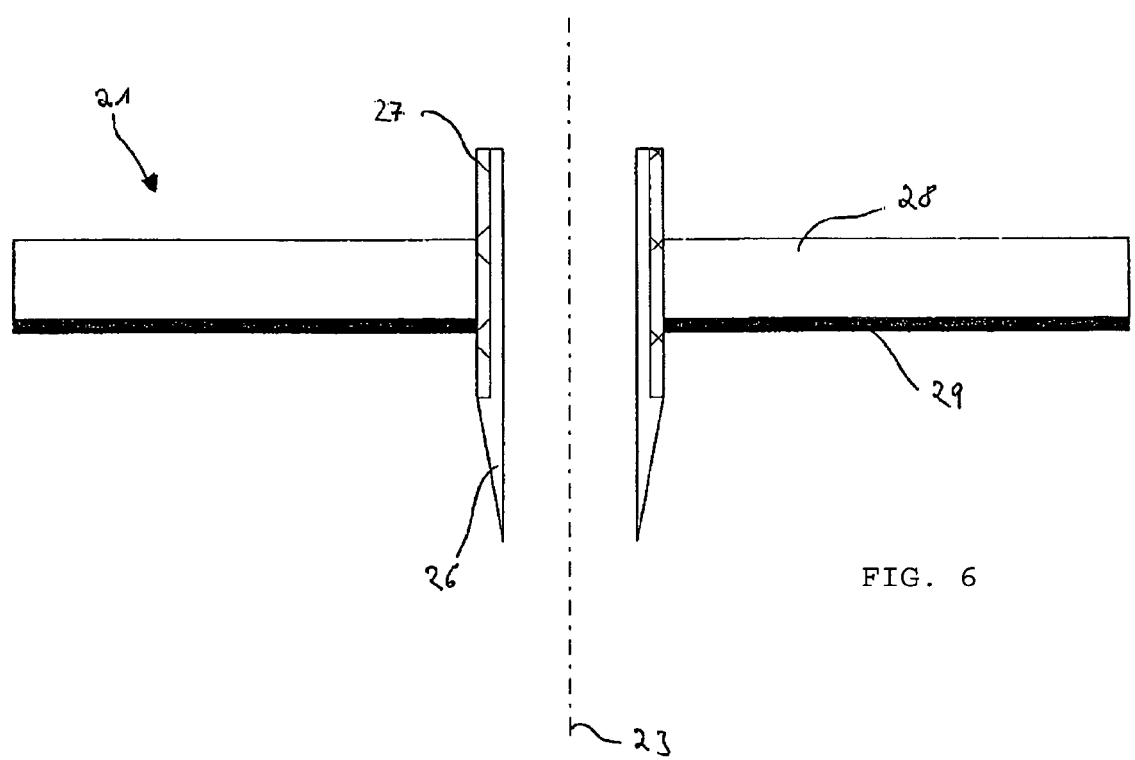
FIG. 6 shows a schematic representation of another embodiment of a detector having a reflector.

The function of the reflector will be explained once again using another exemplary embodiment of detector 21 in accordance with FIG. 6. FIG. 6 shows detector 21, which exhibits a scintillator 29 as a detection surface and which is adjoined by an optical waveguide 28. A photomultiplier (not shown) positioned on the side of detector 21 is series-connected to optical waveguide 28. As already described above, detector 21 exhibits an opening. Metallic tube 27, through which the primary electron beam is able to pass detector 21, is inserted into the opening. The inner diameter of tube 27 is normally 2 mm. This diameter is necessary in order to shield insulating scintillator 28 from the primary electron beam and allows the tube to be designed large enough to be polished so that it may be kept oxide-free.

Conically shaped reflector 26 is inserted into tube 27. When backscattered electrons strike reflector 26, they are scattered on reflector 26 or reflected on the detector or its scintillator 29. The electron yield (detector efficiency) is greater the steeper the conical shape of reflector 26 and the higher the atomic number of the material used to make reflector 26.

The system (also without tube 27) described in FIG. 6 is not just suitable for detecting backscattered electrons. Secondary electrons may also be detected with such a detector. For instance, detector 19 may be designed in such a manner. The described arrangement of reflector 26 is suitable for increasing the electron yield of all electrons for a detector.

Figure 7:
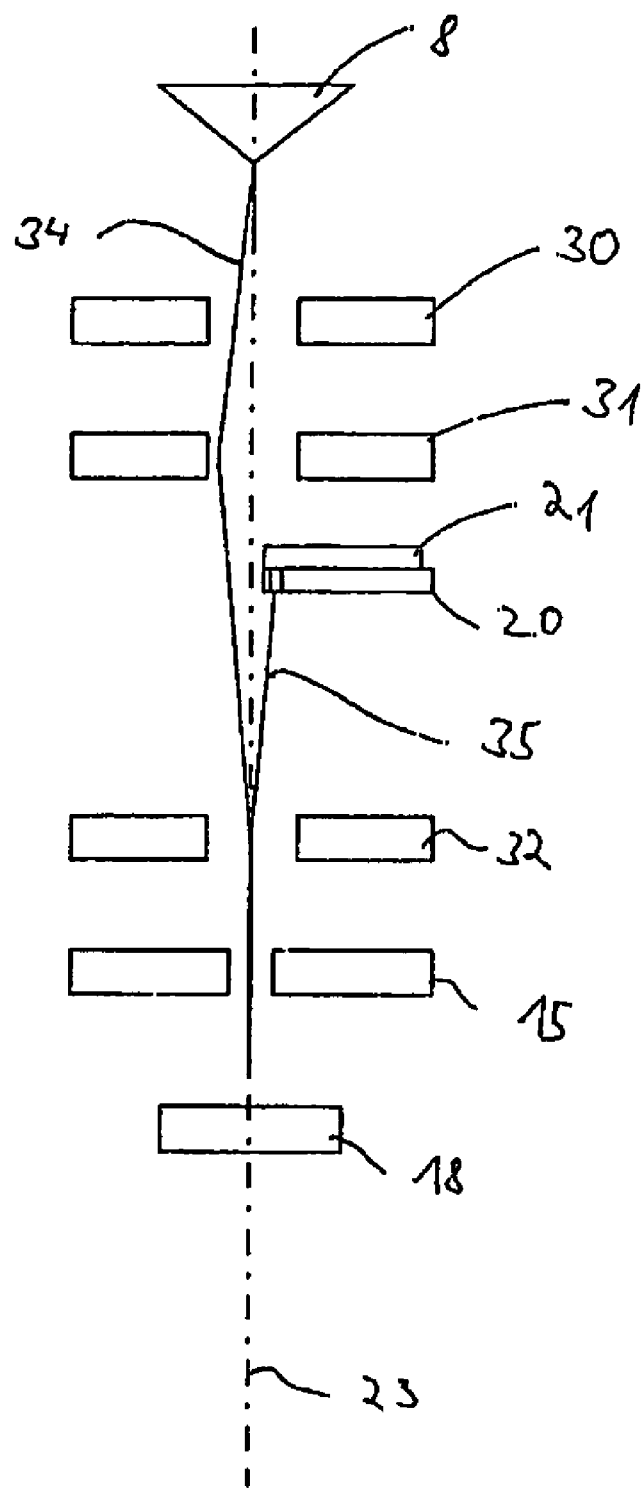
FIG. 7 shows a schematic representation of a deflection device arranged in a scanning electron microscope.

In order to detect even backscattered electrons that are scattered on specimen 18 under a very narrow angle with respect to optical axis 23, the exemplary embodiment in accordance with FIG. 7 provides for detector 21 and apertured diaphragm 20 allocated thereto to be arranged extra-axially to optical axis 23. For this purpose, the scanning electron microscope exhibits a deflection device having deflectors 30, 31, and 32. All deflectors are arranged along optical axis 23 and are designed as magnetic units. Primary electron beam 34 generated by electron source 8 is deflected from optical axis 23 via deflector 30. Through deflector 31, primary electron beam 34 is again directed toward optical axis 23 and subsequently takes the path it would take without the deflectors. Primary electron beam 34 is then scanned over specimen 18 via scanning means 15.

The secondary and backscattered electrons developing on account of the interaction then enter the beam guidance tube of the scanning electron microscope again as secondary beam 35. Secondary electrons as well as backscattered electrons are then deflected on account of deflector 32 in accordance with the Lorentz Force Law into the half-space where detector 21 is located, and which is complementary to the half-space of primary electron beam 34. Through diaphragm 20, the secondary electrons are masked so that detector 21 detects almost exclusively only backscattered electrons.

Figure 8:
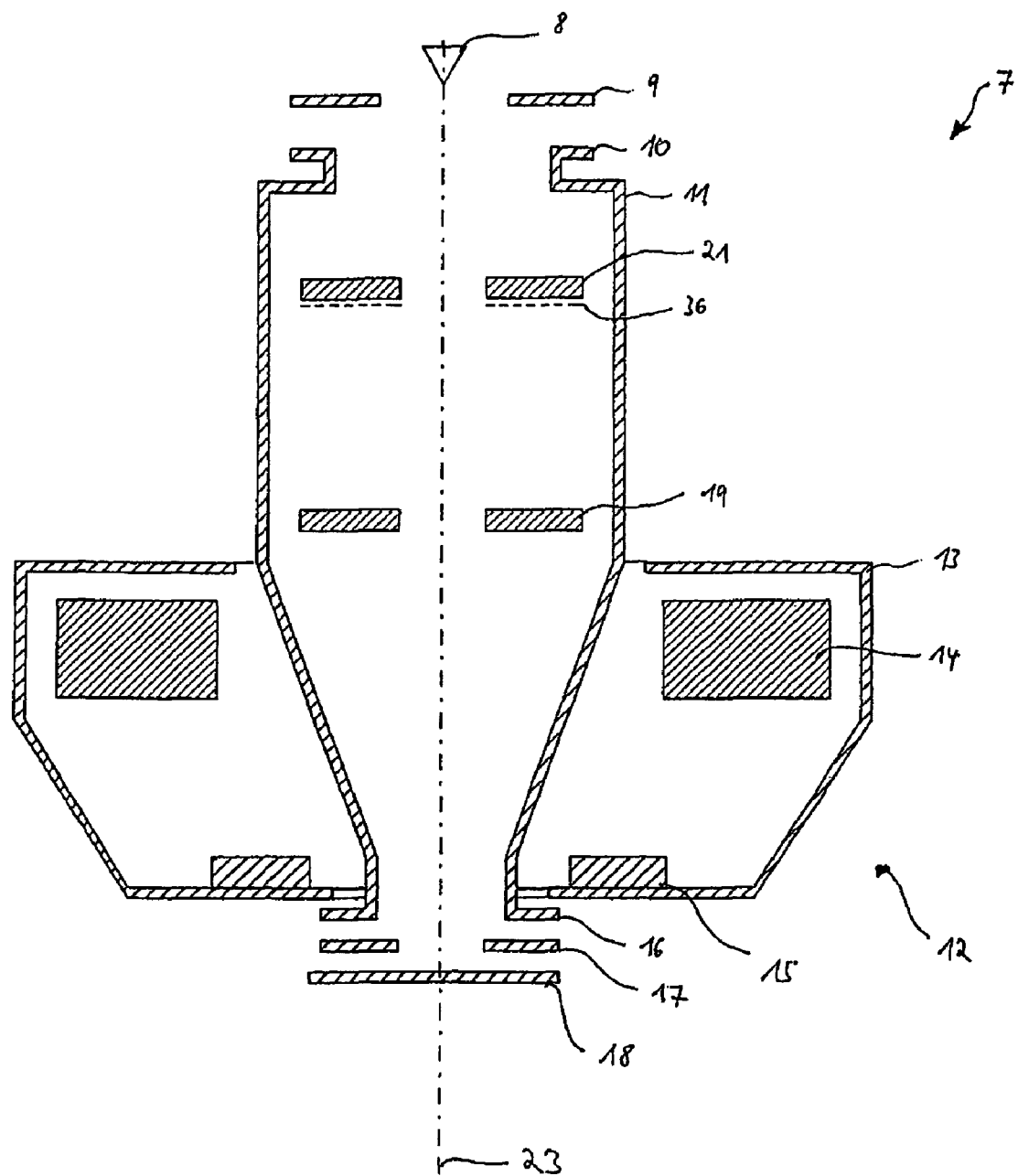
FIG. 8 shows a schematic representation of a scanning electron microscope having a detector to which a diaphragm in the form of an opposing field grid is allocated.

FIG. 8 shows a further exemplary embodiment of a scanning electron microscope in accordance with the present invention. This exemplary embodiment is almost identical to the exemplary embodiment in accordance with FIG. 2. Identical components will therefore be described in the following using the same reference numbers. Detector 21 exhibits an opposing field grid 36. The secondary and backscattered electrons that develop due to the interaction with specimen 18 are again directed into beam guidance tube 11 of the scanning electron microscope. The voltage applied to opposing field grid 36 is chosen such that secondary electrons may be deflected by opposing field grid 36 so that they do not strike detector 21. In this case, only backscattered electrons penetrate opposing field grid 36 and strike deflector 21. The corresponding signals are then used for rendering. Opposing field grid 36 exhibits a voltage of minus 100 volts, for example. The backscattered electrons may pass through the grid because of their energies. The secondary electrons that normally exhibit an energy <50 eV are not able to reach detector 21 because of the voltages applied.

Figure 9:
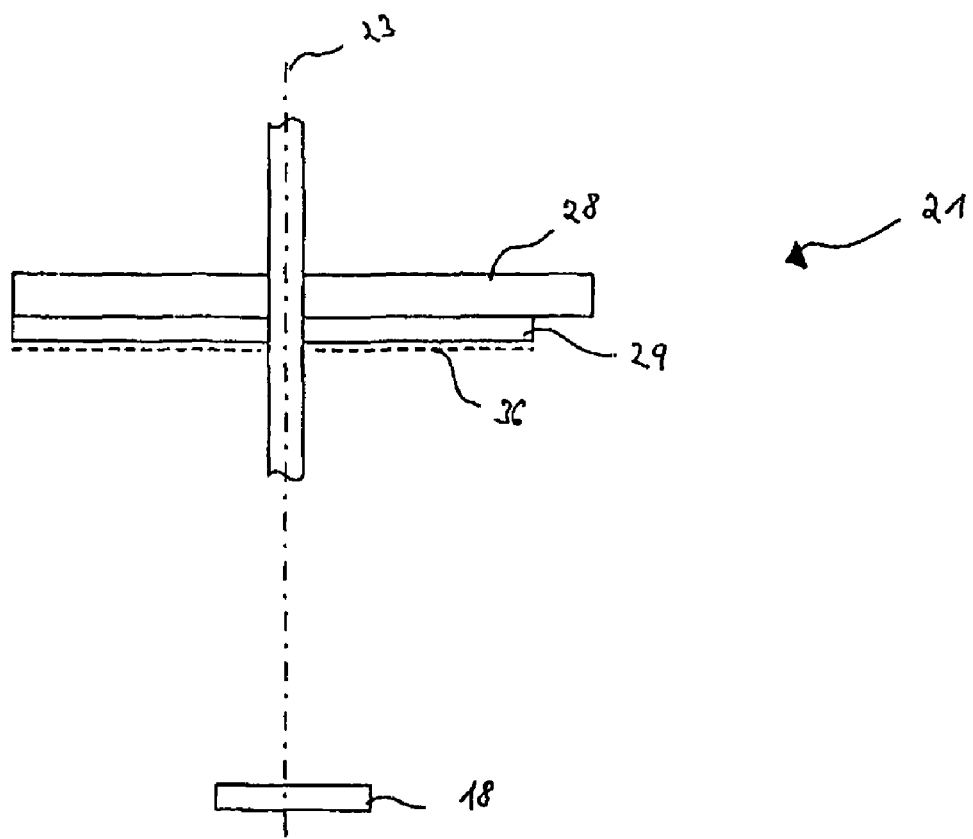
FIG. 9 shows a schematic representation of a detector having a diaphragm according to FIG. 8.

Another embodiment of detector 21, as may be used in the exemplary embodiment in accordance with FIG. 8, is shown in FIG. 9. Detector 21 is shaped like a disk and exhibits a scintillator 29, above which an optical waveguide 28 is arranged. Optical waveguide 28 is in turn connected to a photomultiplier (not shown). Detector 21 exhibits an opening in which a metal tube is accommodated, in which the primary electron beam runs along optical axis 23. The secondary and backscattered electrons that develop due to the interaction with specimen 18 are again fed into the beam guidance tube of the scanning electron microscope. Opposing field grid 36 is arranged in front of scintillator 29. The voltage applied to opposing field grid 36 is chosen such that secondary electrons may be deflected by opposing field grid 36 so that they do not strike scintillator 29. In this case, only backscattered electrons pass through opposing field grid 36 and strike scintillator 29. The corresponding signals are then used for rendering.

Figure 10:
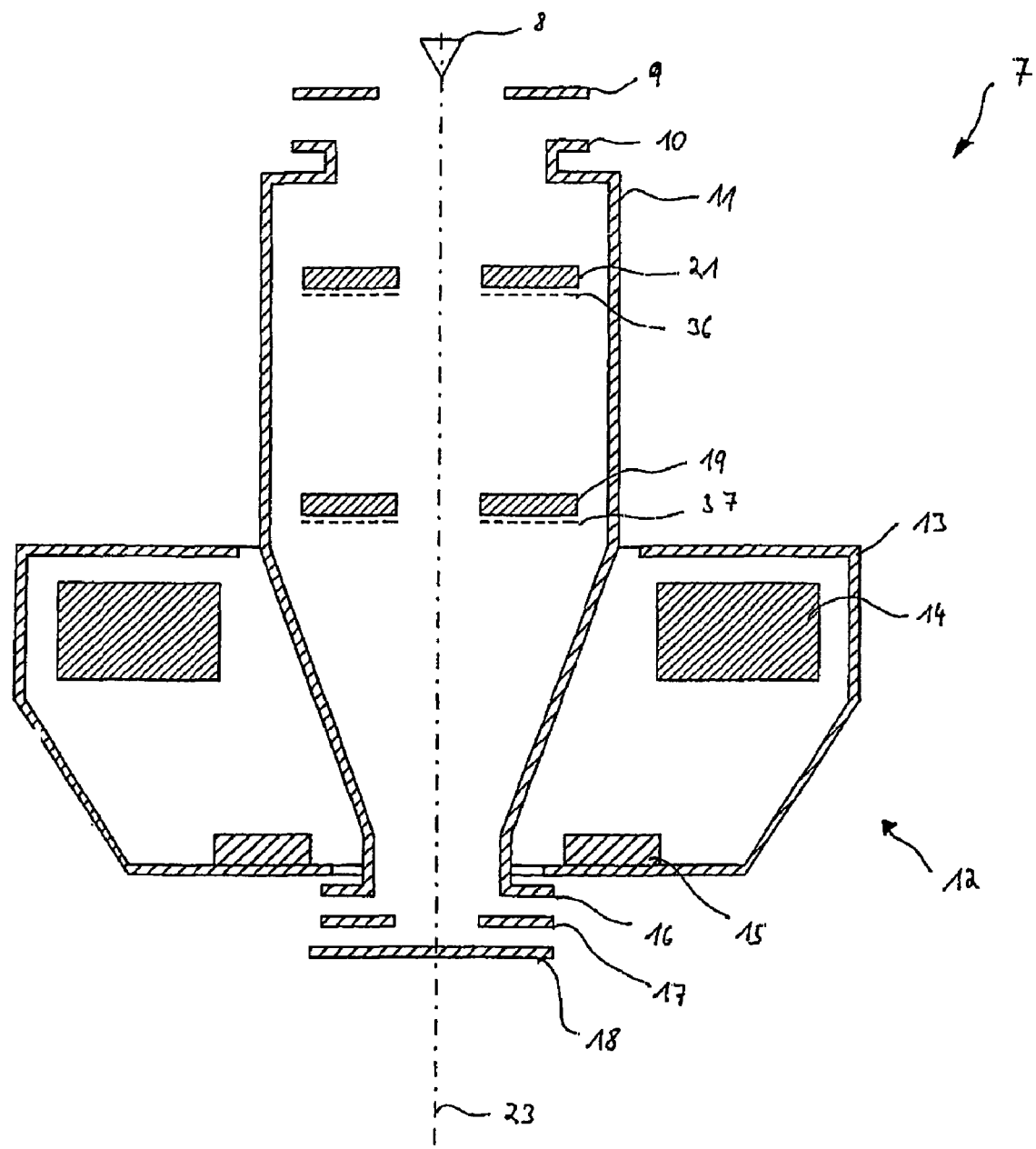
FIG. 10 shows a schematic representation of a scanning electron microscope having two detectors to which diaphragms in the form of opposing field grids are allocated, as well as a scanning element.

Another exemplary embodiment of the scanning electron microscope according to the present invention is shown in FIG. 10. This exemplary embodiment basically corresponds to the exemplary embodiment in accordance with FIG. 8. In contrast thereto, in the exemplary embodiment in accordance with FIG. 10, detector 21 is provided with an opposing field grid 36 and detector 19 with an opposing field grid 37.

Figure 11:
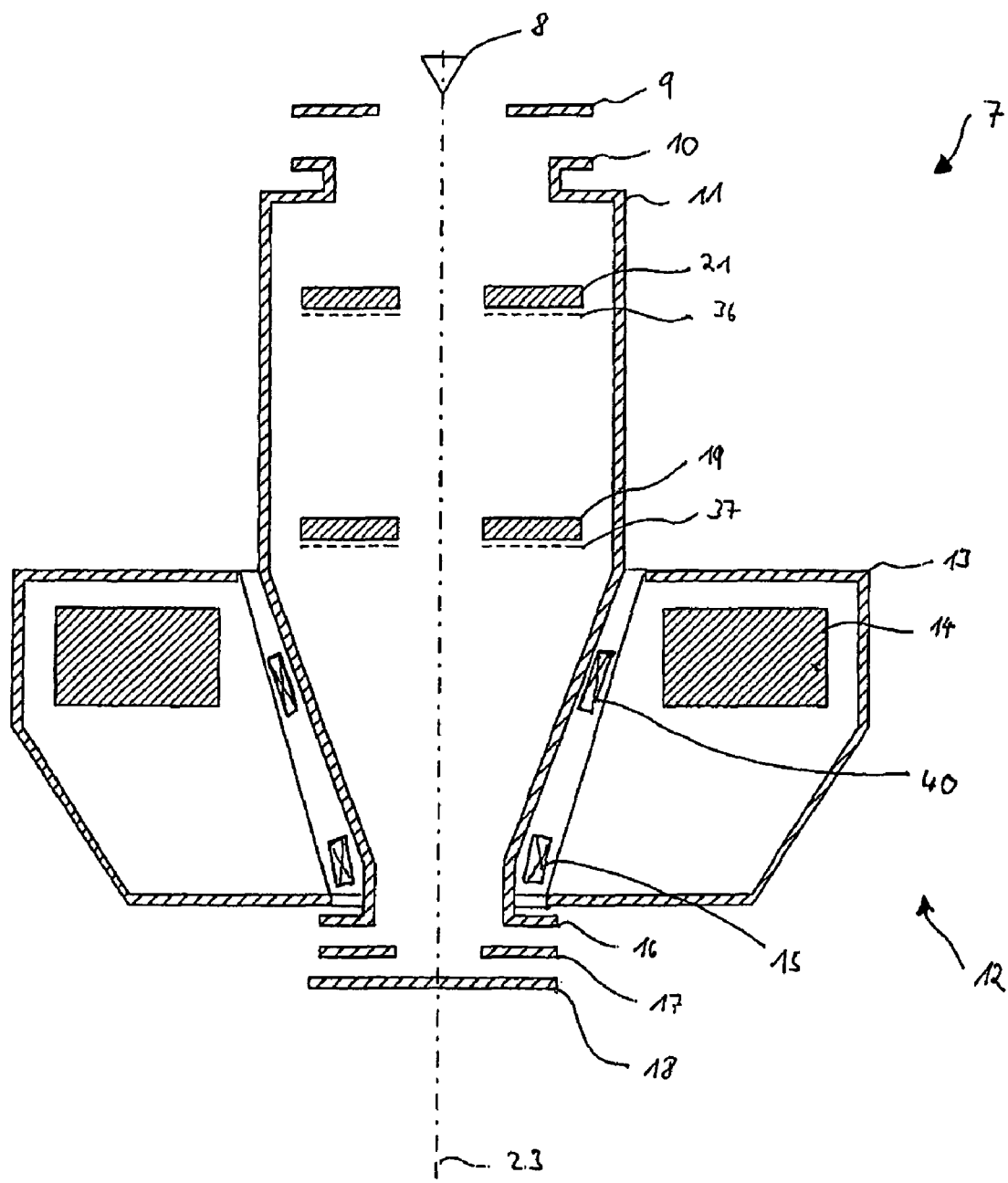
FIG. 11 shows a schematic representation of a scanning electron microscope having two detectors to which diaphragms in the form of opposing field grids are allocated, as well as two scanning elements.

A similar exemplary embodiment of the scanning electron microscope according to the present invention is shown in FIG. 11. Here, the two detectors 19 and 21 also exhibit opposing field grids 36 and 37. Furthermore, two scanning elements 15 and 40 are provided for scanning the primary electron beam over specimen 18. It has been shown that backscattered electrons having a scattering angle of ≧1650 at higher energies of the primary electron beam are not suitable for high-resolution imaging, which may be attributed to the increased multiple scattering of the backscattered electrons. At any rate, because of the geometry of the objective lens as well as of the beam guidance tube, only backscattered electrons having a scattering angle of ≧165° are detected. Using two scanning elements 15, 40 (dual scanning element), the inner width of the beam guidance tube is enlarged so that backscattered electrons scattered at less than 150° may also be detected. These exhibit a small probability for double scattering and thus lead to sharper images. Furthermore, an increase in the transmission of electrons is achieved.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An electron-beam device having an optical axis, comprising:
   a beam generator that generates an electron beam;
   an objective lens that focuses the electron beam on an object;

at least one detector that detects at least one of: electrons scattered on the object and electrons emitted by the object; and at least one adjustable diaphragm which is allocated to the at least one detector, wherein a position of the at least one adjustable diaphragm in the electron-beam device is adjustable.

2. The electron-beam device as recited in claim 1, wherein the at least one detector and the at least one adjustable diaphragm are positioned along the optical axis of the electron-beam device, and wherein the at least one detector is positioned closer to the beam generator than the at least one adjustable diaphragm.

3. The electron-beam device as recited in claim 1, wherein the position is at least one of: adjustable along the optical axis and adjustable perpendicularly to the optical axis.

4. The electron-beam device as recited in claim 1, wherein the at least one adjustable diaphragm is arranged at a position along the optical axis where the electrons scattered on the object form a crossover.

5. The electron-beam device as recited in claim 1, further comprising:

a positioning device disposed in the electron-beam device for moving the position of the at least one adjustable diaphragm.

6. The electron-beam device as recited in claim 1, wherein the at least one adjustable diaphragm includes at least one diaphragm opening for passage of electrons, and wherein a size of the diaphragm opening is adjustable.

7. The electron-beam device as recited in claim 1, further comprising:

a scanning device that directs the electron beam toward the object.

8. The electron-beam device as recited in claim 7, wherein the scanning device includes at least two scanning elements per plane.

9. The electron-beam device as recited in claim 1, wherein the at least one adjustable diaphragm and the at least one detector are positioned extra-axially to the optical axis.

10. The electron-beam device as recited in claim 1, further comprising:

at least one deflection device having at least one deflector for directing the electron beam from and toward the optical axis.

11. The electron-beam device as recited in claim 10, wherein the deflector is a magnetic unit.

12. The electron-beam device as recited in claim 10, wherein the deflector is arranged in the electron-beam device in a region between the object and the beam generator.

13. The electron-beam device as recited in claim 10, wherein the at least one deflection device includes a first deflector that directs the electron beam out of the optical axis and a second deflector that directs the electron beam into the optical axis.

14. The electron-beam device as recited in claim 10, wherein the at least one deflection device includes a first deflector that directs the electron beam out of the optical axis, a second deflector that steers the electron beam toward the optical axis, and a third deflector that directs the electron beam into the optical axis.

15. The electron-beam device as recited in claim 1, wherein the at least one detector includes at least two detection regions.

16. The electron-beam device as recited in claim 1, wherein the at least one detector is a first detector positioned on a generator side along the optical axis, and wherein the electron-beam device further comprises a second detector positioned on an object side along the optical axis.

17. The electron-beam device as recited in claim 16, wherein the second detector forms the diaphragm.

18. The electron-beam device as recited in claim 16, further comprising:

at least one opposing field grid between the first detector and the second detector, wherein a voltage is applied to the at least one opposing field grid such that a portion of electrons emitted by the object and having passed the second detector is not detected by the first detector.

19. The electron-beam device as recited in claim 1, wherein the at least one diaphragm includes an area on which lateral faces are arranged that stretch toward a point situated above the area.

20. The electron-beam device as recited in claim 19, wherein the at least one diaphragm is at least partially conical.

21. The electron-beam device as recited in claim 1, wherein the at least one diaphragm is at least partially discoid.

22. The electron-beam device as recited in claim 1, wherein the at least one diaphragm is made of a material having a high atomic number.

23. The electron-beam device as recited in claim 1, further comprising:

an electron energy controlling device that accelerates and slows down the electrons of the electron beam to specified energies and maintains the energies after acceleration.

* * * * *

UNITED STATES PATENT AND TRADEMARK OFFICE
CERTIFICATE OF CORRECTION

| | | |
|---|---|---|
| PATENT NO. | : 7,910,887 B2 | Page 1 of 1 |
| APPLICATION NO. | : 12/380596 | |
| DATED | : March 22, 2011 | |
| INVENTOR(S) | : Michael D. G. Steigerwald et al. | |

It is certified that error appears in the above-identified patent and that said Letters Patent is hereby corrected as shown below:

Col. 6, lines 48-49, replace "a-transmission region" with -- a transmission region --.

Col. 10, line 42, replace "1650" with -- 165° --.

Signed and Sealed this
Twentieth Day of December, 2011

David J. Kappos
*Director of the United States Patent and Trademark Office*